(12) United States Patent
Rost et al.

(10) Patent No.: US 6,221,705 B1
(45) Date of Patent: *Apr. 24, 2001

(54) METHOD FOR IMPROVING PERFORMANCE AND RELIABILITY OF MOS TECHNOLOGIES AND DATA RETENTION CHARACTERISTICS OF FLASH MEMORY CELLS

(75) Inventors: Timothy A. Rost, Plano; Kenneth C. Harvey, Dallas, both of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/123,605

(22) Filed: Jul. 28, 1998

Related U.S. Application Data

(60) Provisional application No. 60/053,967, filed on Jul. 28, 1997.

(51) Int. Cl.⁷ .................................................. H01L 21/336
(52) U.S. Cl. .......................... 438/197; 438/238; 438/398; 257/607
(58) Field of Search ..................................... 438/238, 398, 438/197; 257/607

(56) References Cited

U.S. PATENT DOCUMENTS

| | | | |
|---|---|---|---|
| 5,872,387 | * 2/1999 | Lyding et al. | 257/607 |
| 5,877,051 | * 3/1999 | Manning | 438/238 |
| 5,960,294 | * 9/1999 | Zahurak et al. | 438/398 |

* cited by examiner

*Primary Examiner*—Richard Elms
*Assistant Examiner*—Pho Luu
(74) *Attorney, Agent, or Firm*—Wade James Brady, III; Frederick J. Telecky, Jr.

(57) ABSTRACT

A method of fabricating a semiconductor device wherein there is provided a semiconductor substrate, preferably of silicon, having a gate insulator thereover, preferably of silicon dioxide, forming a junction, preferably a silicon/silicon dioxide interface, and a gate electrode, preferably of doped polysilicon, over the partially fabricated device. Deuterium is implanted into the structure and the deuterium is caused to diffuse through the deivce. The device fabrication is then completed.

24 Claims, 2 Drawing Sheets

METHOD FOR IMPROVING PERFORMANCE AND RELIABILITY OF MOS TECHNOLOGIES AND DATA RETENTION CHARACTERISTICS OF FLASH MEMORY CELLS

This application claims priority under 35 USC 119(e)(1) of provisional application Ser. No. 60/053,967 filed Jul. 28, 1997.

BACKGROUND OF THE INVENTION

1. Field of the Invention

This invention relates to a method of passivating silicon bonds in semiconductor devices by a species, particularly deuterium.

2. Brief Description of the Prior Art

It is known that channel hot carrier (CHC) effects progressively degrade the performance of transistors, this effect being particularly apparent in VLSI CMOS transistors. Specifically, for any given bias condition, the channel current decreases over time. This aging process is thought to occur, in part, as a result of hot electrons stimulating the desorption of hydrogen from the $Si/SiO_2$ interface region. Hydrogen is introduced by necessity during several device processing steps, for example during the sintering of wafers at an elevated temperature in a hydrogen ambient.

To avoid the problems resulting from hot carrier effects, the drain voltage and gate length of the transistors must not be changed beyond certain values. This limits the performance of the transistor. By reducing the degradation from hot carrier effects, the design limits of the transistor are improved and a higher performance, more reliable transistor is achieved. While this process improves device function, it sets the stage for subsequent hot electron degradation.

In an article entitled "Reduction of hot electron degradation in metal oxide semiconductor transistors by deuterium processing" by J. W. Lyding et al., *Applied Physics Letters*, Vol. 68, No. 18, Apr. 29, 1996, it is noted that replacing hydrogen with deuterium during the final wafer sintering process reduces hot electron degradation effects in metal oxide semiconductor transistors. The exact cause of this large isotope effect was not known. This substitution increased the CHC lifetime of the transistor by factors of 10 to 50, this being borne out by the applicants herein. However, Lyding et al. delivered the deuterium to the region of the gate oxide in an oven through thermal diffusion. This causes most of the deuterium to be wasted. In addition, during the sintering process, the deuterium may experience difficulty diffusing through some materials to reach the $Si/SiO_2$ interface, especially in those cases where several layers of metalization are located between the deuterium implant and the $Si/SiO_2$ interface.

It is also known in the case of flash memories which include a pair of insulator layers (interpolysilicon oxide layer and tunnel oxide layer) interleaved with a pair of polysilicon layers or the like, that each time the flash memory is written into or erased, charge moves through the dielectric layers surrounding the hanging polysilicon layer. This charge movement, over time, leads to a degradation of the electrical properties of the dielectric. This degradation can lead to charge loss on the storage cell, which can cause data loss. It is highly desirable to improve the quality of these surrounding dielectric layers to prevent or at least minimize this problem.

There has been no known solution to completely eliminate the wearout of the dielectric in flash memories. Generally, attention has been focused on improving the quality of the oxide or on optimizing the operation.

SUMMARY OF THE INVENTION

It is therefore a purpose of this invention to improve by ion or neutral implantation of deuterium the hot carrier lifetimes of MOS transistors with gates containing a silicon trioxide gate oxide as well as to improve the data retention characteristics of flash memory cells.

Although the gate insulator material herein is referred to as $SiO_2$, it is to be understood that the invention also applies to gates that also contain nitrides or are solely comprised of nitrides or that include other possible gate insulator materials, such as, for example, tantalum pentoxide.

Briefly, in accordance with the present invention, deuterium is introduced into the semiconductor device by implantation, instead of by thermal diffusion as was done by Lyding et al. The implantation may be accomplished at any step of the semiconductor process flow. Examples with be provided hereinbelow. In general, deuterium implantation is provided so that, during subsequent thermal cycles, the deuterium will diffuse to the gate oxide/silicon interface and become chemically attached to the dangling bonds at that interface, this generally being the $Si/SiO_2$ or polysilicon/$SiO_2$ interface. The energy, dose and point defects of the implant are optimized to effect this.

The following are examples in which implantation is used to introduce deuterium to the structure, although many other possibilities will be readily apparent. These and other imnplants may be used in combination. (1) When the last metal level is completed, deuterium can be implanted into the inter-level dielectric, typically but not limited to an oxide, and then annealed in standard manner. (2) When the side-wall material is deposited, deuterium may be implanted into the side-wall material to add-to and/or displace the existing hydrogen in the side-wall material. (3) Deuterium may be implanted at any point in the process flow into the polysilicon that comprises the transistor gate which is above the gate oxide. (4) Deuterium may be implanted into the silicon, below the gate oxide, in the region that comprises the channel of the transistor at any point in the process flow.

By the method in accordance with the present invention, less deuterium gas is consumed as compared with the above described prior art. Ion implantation reduces isotopic contamination from hydrogen and tritium and, thereby, reduces CHC degradation from hydrogen and reliability problems from tritium decay, such as soft error rates (SER).

With reference to the flash memories, it is believed that the dielectric wearout is due to the accumulation of unpassivated defect sites in the oxide and that deuterium is less likely to be removed from these cites than is hydrogen. Anneals in a deuterium-containing, essentially hydrogen-free ambient, such as from about 10 percent to about 100 percent by volume deuterium and the remainder a gas inert to the operations being conducted, preferably nitrogen passivate defect sites with the deuterium. The deuterium is less likely to dissociate from the defect site and move through the structure than is hydrogen due to the difference in mass therebetween. Annealing will take place at a temperature above the dissociation temperature for hydrogen and silicon, this being above about 500 degrees C. for a period of from about 15 to about 30 minutes and preferably about 15 minutes.

DESCRIPTION OF THE PREFERRED EMBODIMENT

Figure 1:
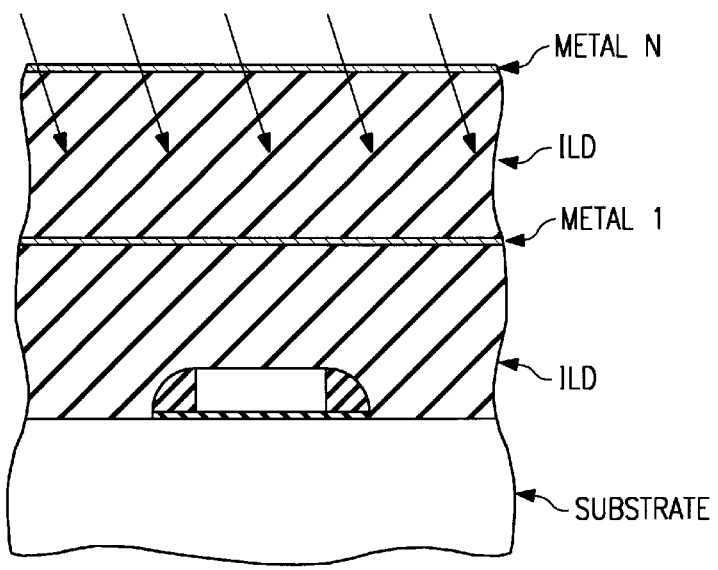
FIG. 1 is a cross sectional view of a portion of a portion of a partially fabricated semiconductor wafer with a deuterium implant in the interlevel dielectric.

Referring first to FIG. 1, there is shown a cross sectional view of a portion of a partially fabricated semiconductor wafer with a deuterium implant in an inter-level substrate. There is shown a partially fabricated MOS transistor having a silicon substrate portion formed of polysilicon, generally doped polysilicon. Prior to completion of processing, deuterium is implanted with energy of from about 40 to about 60 KeV and a dose greater than about $10^{15}$ into the inter-level dielectric and allowed to diffuse to the defect sites of the gate oxide during subsequent fabrication and especially during annealing steps. At least some of this diffusion takes place in the direction of the silicon/silicon dioxide interface where the deuterium bonds with dangling silicon sites. This implant can be provided instead of the usual hydrogen sinter step, for example. The fabrication process then proceeds in standard manner.

Figure 2:
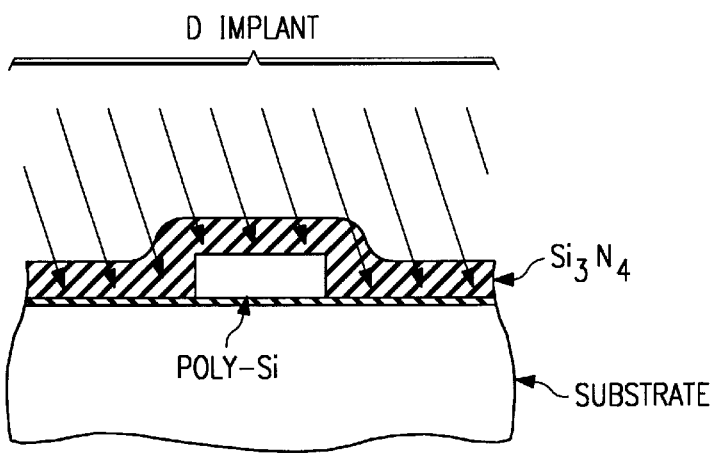
FIG. 2 is a cross sectional view of a portion of a partially fabricated semiconductor wafer with a deuterium implant in the sidewall material.

Referring to FIG. 2, there is shown a process flow for a cross sectional view of a portion of a partially fabricated semiconductor wafer with a deuterium implant in the sidewall material. In FIG. 2 there is shown a silicon substrate 11 having a gate oxide layer 13 thereon. A patterned layer of polysilicon 15 is disposed over the gate oxide layer 13. A layer of silicon nitride 17 is conformally deposited over the suface as shown in FIG. 2 and deuterium ions 19 are implanted into the structure of the silicon nitride layer as shown in FIG. 2. With an increase in temperature above the dissociation temperature of silicon and hydrogen and a later lowering of the temperature below the dissociation temperature, the deuterium will migrate to the available sites on the silicon to provide a substantially deuterium-doped silicon nitride layer.

Figure 3:
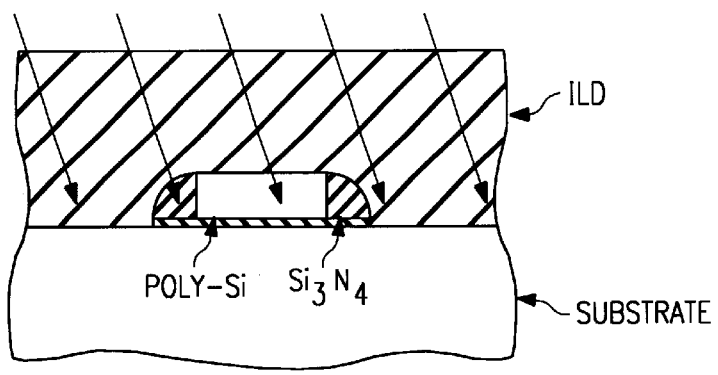
FIG. 3 is a cross sectional view of a portion of a partially fabricated semiconductor wafer with a deuterium implant in the gate electrode.

Referring now to FIG. 3, there is shown a partially fabricated MOS transistor having a silicon substrate portion 21, a gate oxide 23 formed of silicon dioxide and a gate electrode 25 formed of polysilicon, generally doped polysilicon. Prior to introduction of any levels of metal, deuterium 27 is implanted into the gate electrode 13 and allowed to diffuse in the gate oxide during subsequent fabrication and especially during annealing steps. At least some of this diffusion takes place in the direction of the substrate 21/silicon dioxide 23 interface 27 where the deuterium bonds with dangling silicon cites. The fabrication process then proceeds in standard manner with implanting of source/drain regions in the substrate 21 (not shown) and addition of layers of metallization (not shown) which will provide connection to the source/drain regions and the gate electrode 25 as well as system interconnect as is well known. During the addition of the metal layers and intervening insulator layers, the deuterium will diffuse toward the interface 27.

Figure 5:
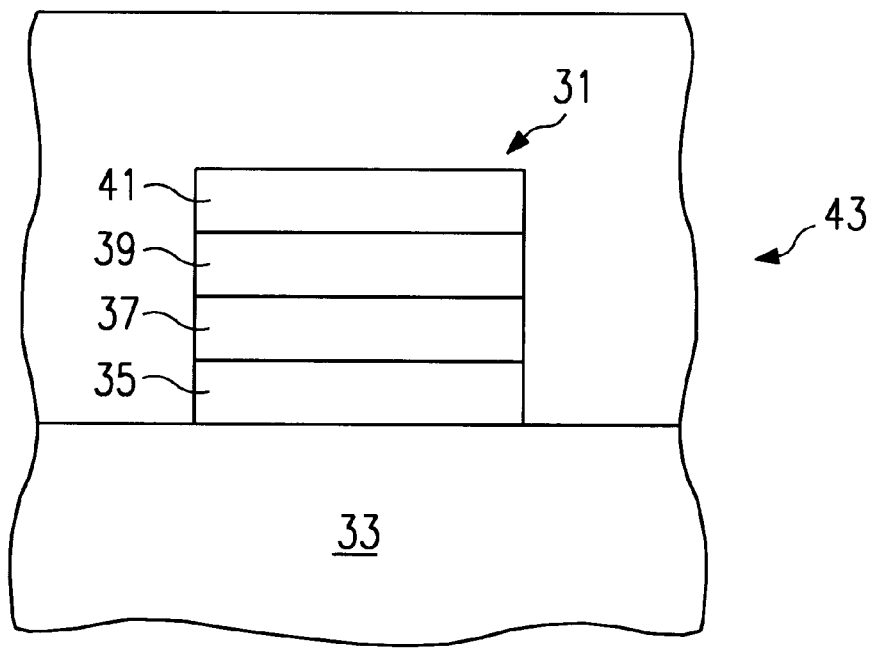
FIG. 5 is a schematic diagram of the gate structure of a typical flash memory which is placed in a deuterium-containing and essentially hydrogen-free ambient during anneal.

Referring now to FIG. 5, there is shown a partially fabricated flash memory 31 having a silicon substrate 33 with alternating layers thereon of silicon dioxide 35, polysilicon 37, silicon dioxide 39 and polysilicon 41. The memory 31 is disposed in a chamber 43 having an ambient containing about 10 percent by volume deuterium and 90 percent by volume nitrogen and heated to a temperature of 525 which is above the dissociation temperature of hydrogen and silicon for 30 minutes. The deuterium migrates into the structure of the polysilicon layers 37, 41 and the structure of the silicon dioxide layers 35, 39 and occupy available bonding sites with the silicon. Since the number of available deuterium atoms in the structures is now far greater than the number of hydrogen atoms, a substantial number of the available sites on the silicon atoms will be filled with deuterium.

Figure 4:
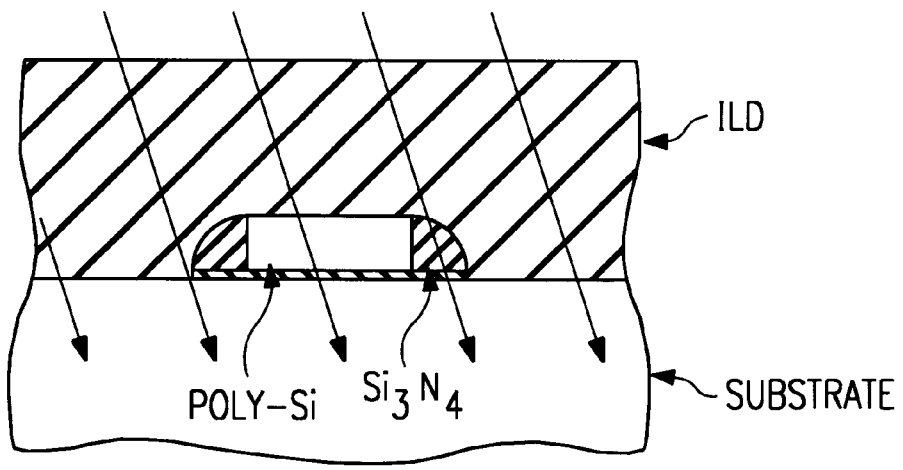
FIG. 4 is a cross sectional view of a portion of a partially fabricated semiconductor wafer with a deuterium implant in the substrate.

Referring to FIG. 4, there is shown a cross sectional view of a portion of a partially fabricated MOS transistor having a silicon substrate portion 1, a gate oxide 3 formed of silicon dioxide and a gate electrode 5 formed of polysilicon, generally doped polysilicon. Prior to introduction of any levels of metal, deuterium 7 is implanted into the substrate 1 and allowed to diffuse in the substrate during subsequent fabrication and especially during annealing steps. At least some of this diffusion takes place in the direction of the substrate 1/silicon dioxide 3 interface 7 where the deuterium bonds with dangling silicon cites.

The fabrication process then proceeds in standard manner with implanting of source/drain regions in the substrate 1 (not shown) and addition of layers of metallization (not shown) which will provide connection to the source/drain regions and the gate electrode 5 as well as system interconnect as is well known. During the addition of the metal layers and intervening insulator layers, the deuterium will diffuse toward the interface 7.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating a semiconductor device which comprises the steps of:

(a) providing a semiconductor substrate having a gate insulator thereover forming a junction with said semiconductor substrate and a gate electrode over said gate insulator and spaced from said semiconductor substrate;

(b) implanting deuterium into said semiconductor substrate;

(c) causing said deuterium to diffuse to said junction; and (d) then forming a first layer of metal over said semiconductor substrate.

2. The method of claim 1 wherein said substrate is silicon, said insulator is a gate insulator and said electrode is a gate electrode.

3. The method of claim 2 wherein said gate insulator is silicon dioxide.

4. The method of claim 3 wherein said gate electrode is polysilicon.

5. The method of claim 2 wherein said gate electrode is polysilicon.

6. The method of claim 1 wherein said insulator is silicon dioxide.

7. The method of claim 6 wherein said electrode is polysilicon.

8. The method of claim 1 wherein said electrode is polysilicon.

9. A method of fabricating a semiconductor device which comprises the steps of:
(a) providing a semiconductor substrate having a gate insulator thereover forming a junction with said semiconductor substrate and a gate electrode over said gate insulator and spaced from said substrate;
(b) implanting deuterium into said gate insulator;
(c) causing said deuterium to diffuse to said junction; and
(d) then forming a first layer of metal over said semiconductor substrate.

10. The method of claim 9 wherein step (c) comprises heating said partially fabricated device to a temperature above the dissociation temperature of silicon and hydrogen; permitting said deuterium to diffuse through the structure of said device, then cooling said device to below the dissociation temperature of hydrogen and silicon and removing said device from said chamber and said deuterium-containing ambient.

11. The method of claim 10 wherein said substrate is silicon.

12. The method of claim 11 wherein said temperature is above 500 degrees C.

13. The method of claim 12 wherein said device is maintained at said temperature above 500 degrees C. for from about 5 to about 30 minutes.

14. The method of claim 9 wherein said substrate is silicon.

15. The method of claim 14 wherein said temperature is above 500 degrees C.

16. The method of claim 15 wherein said device is maintained at said temperature above 500 degrees C. for from about 5 to about 30 minutes.

17. A method of fabricating a semiconductor device which comprises the steps of:
(a) providing a semiconductor substrate having a gate insulator thereover forming a junction with said semiconductor substrate and a gate electrode over said gate insulator and spaced from said semiconductor substrate;
(b) implanting deuterium into said gate electrode;
(c) causing said deuterium to diffuse to said junction; and
(d) then forming a first layer of metal over said semiconductor substrate.

18. The method of claim 17 wherein step (c) comprises heating said partially fabricated device to a temperature above the dissociation temperature of silicon and hydrogen; permitting said deuterium to diffuse through the structure of said device, then cooling said device to below the dissociation temperature of hydrogen and silicon and removing said device from said chamber and said deuterium-containing ambient.

19. The method of claim 17 wherein said substrate is silicon.

20. The method of claim 18 wherein said substrate is silicon.

21. The method of claim 19 wherein said temperature is above 500 degrees C.

22. The method of claim 20 wherein said temperature is above 500 degrees C.

23. The method of claim 21 wherein said device is maintained at said temperature above 500 degrees C. for from about 5 to about 30 minutes.

24. The method of claim 22 wherein said device is maintained at said temperature above 500 degrees C. for from about 5 to about 30 minutes.

* * * * *